(12) United States Patent
Zhang et al.

(10) Patent No.: US 12,707,779 B2
(45) Date of Patent: Aug. 11, 2026

(54) ARRAY BASE PLATE AND LIGHT EMITTING APPARATUS

(71) Applicants: HEFEI BOE RUISHENG TECHNOLOGY CO., LTD., Hefei (CN); BOE Technology Group Co., Ltd., Beijing (CN)

(72) Inventors: Bing Zhang, Beijing (CN); Hai Tang, Beijing (CN); Xiao Wang, Beijing (CN); Chaoren Lv, Beijing (CN); Ping Kang, Beijing (CN); Liang Gao, Beijing (CN)

(73) Assignees: HEFEI BOE RUISHENG TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 833 days.

(21) Appl. No.: 18/015,499

(22) PCT Filed: Feb. 23, 2022

(86) PCT No.: PCT/CN2022/077455

§ 371 (c)(1),
(2) Date: Jan. 10, 2023

(87) PCT Pub. No.: WO2023/159387

PCT Pub. Date: Aug. 31, 2023

(65) Prior Publication Data

US 2024/0266485 A1 Aug. 8, 2024

(51) Int. Cl.
*H10H 20/857* (2025.01)
*H10W 90/00* (2026.01)

(52) U.S. Cl.
CPC .......... *H10H 20/857* (2025.01); *H10W 90/00* (2026.01)

(58) Field of Classification Search
CPC . H10H 20/857; H01L 25/0753; H01L 23/498; G02F 1/1336
See application file for complete search history.

(56) References Cited

U.S. PATENT DOCUMENTS 5,329,423 A * 7/1994 Scholz .................. H05K 3/325 361/767
5,665,996 A * 9/1997 Williams ............... H10D 30/66 257/784

(Continued)

FOREIGN PATENT DOCUMENTS

CN 111276471 A 6/2020
CN 211125693 U 7/2020

(Continued)

*Primary Examiner* — Victor A Mandala
(74) *Attorney, Agent, or Firm* — WHDA, LLP

(57) ABSTRACT

The present application provides an array base plate and a light emitting apparatus, which relates to the technical field of displaying. The array base plate includes: a substrate; and a plurality of electrically-conductive-pad groups located on the substrate, wherein each of the electrically-conductive-pad groups includes at least one electrically conductive pad; the electrically conductive pad includes an electrically conducting layer and a first connecting layer, the first connecting layer is located on one side of the electrically conducting layer away from the substrate, and an orthographic projection of the first connecting layer on the substrate and an orthographic projection of the electrically conducting layer on the substrate at least partially intersect or overlap; and a thickness of the first connecting layer in a thickness direction of the substrate is greater than or equal to a thickness of the electrically conducting layer in the thickness direction of the substrate.

17 Claims, 8 Drawing Sheets

(56) References Cited

U.S. PATENT DOCUMENTS 11,664,347 B2 * 5/2023 Tan ...................... H10H 20/857
257/88
12,010,795 B2 * 6/2024 Nam ...................... H05K 1/113
2009/0020322 A1 1/2009 Hsu
2012/0067635 A1 * 3/2012 Nang ................... B23K 1/0016
228/203
2015/0049481 A1 * 2/2015 Oyamada ............... H05B 33/06
313/503
2017/0194307 A1 * 7/2017 Liu ....................... H10W 90/00
2018/0190876 A1 * 7/2018 Liu ........................ H10H 20/84
2019/0181122 A1 * 6/2019 Hsu ....................... H10W 90/00
2020/0091376 A1 * 3/2020 Lim ..................... H10H 20/832
2020/0091378 A1 * 3/2020 Fan ........................ H10H 20/84
2020/0313049 A1 * 10/2020 Huang ................. H10H 20/841
2020/0357950 A1 * 11/2020 Takagi ................... H10H 20/01
2021/0167045 A1 * 6/2021 Meng .................... H10W 90/00
2021/0210463 A1 * 7/2021 Tan ...................... H10H 20/857
2022/0238352 A1 7/2022 Hsu et al.
2022/0285599 A1 * 9/2022 Ki ........................ H10H 20/857
2022/0310660 A1 9/2022 Cao et al.
2022/0338346 A1 * 10/2022 Nam ...................... H05K 1/113
2023/0163142 A1 * 5/2023 Lu .......................... H10D 86/60
257/91
2023/0317898 A1 * 10/2023 Wang ................... H10H 20/841
257/79

FOREIGN PATENT DOCUMENTS

CN 113270322 A 8/2021
CN 114077110 A 2/2022
WO 2022056842 A1 3/2022

* cited by examiner

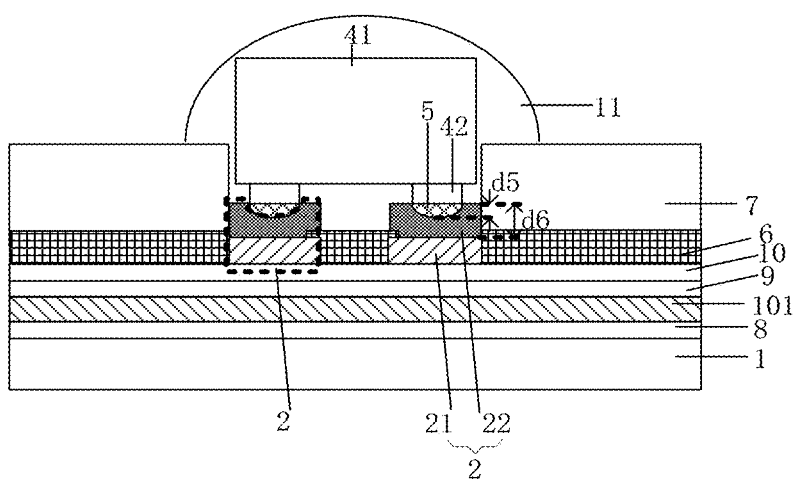
FIG. 7
FIG. 8
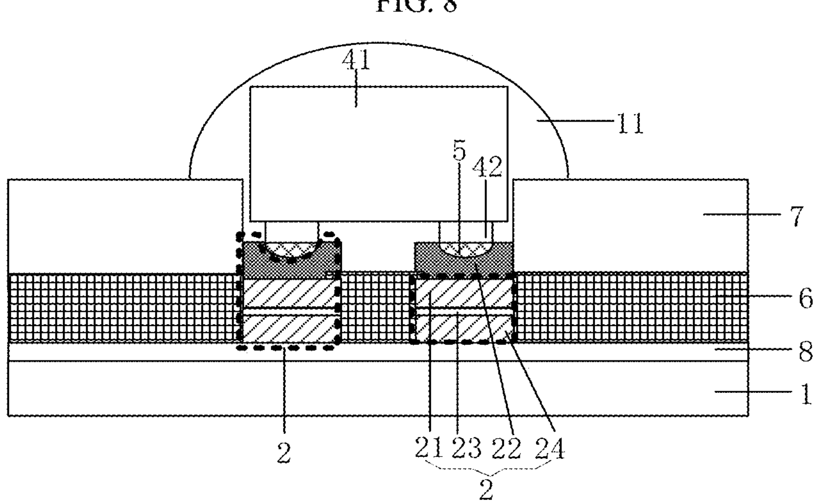
FIG. 9

ARRAY BASE PLATE AND LIGHT EMITTING APPARATUS

TECHNICAL FIELD

The present application relates to the technical field of displaying and, more particularly, to an array base plate and a light emitting apparatus.

BACKGROUND

With the rapid development of the technique of displaying, display products of Mini Light Emitting Diode (Mini LED) and Micro Light Emitting Diode (Micro LED) have attracted broad attention. The soldering of the chips is an important step of the production of the two types of display products. In the related art, the problem of switching-on imperfects very easily appears in the soldering of the chips, which results in connection imperfects between the chips and the array base plate of the display products, and thus results in the deterioration of the yield and the quality of the display products.

SUMMARY

The embodiments of the present application employ the following technical solutions:

In the first aspect, an embodiment of the present application provides an array base plate, wherein the array base plate includes:

a substrate; and a plurality of electrically-conductive-pad groups located on the substrate, wherein each of the electrically-conductive-pad groups includes at least one electrically conductive pad;

the electrically conductive pad includes an electrically conducting layer and a first connecting layer, the first connecting layer is located on one side of the electrically conducting layer away from the substrate, and an orthographic projection of the first connecting layer on the substrate and an orthographic projection of the electrically conducting layer on the substrate at least partially intersect or overlap; and a thickness of the first connecting layer in a thickness direction of the substrate is greater than or equal to a thickness of the electrically conducting layer in the thickness direction of the substrate.

In some embodiments of the present application, each of the electrically-conductive-pad groups includes at least two the electrically conductive pad, the array base plate further includes an insulating layer, and the insulating layer is located between the electrically conductive pads of a same one electrically-conductive-pad group; and a distance from a surface of the insulating layer away from the substrate to the substrate in the thickness direction of the substrate is less than or equal to a distance from a surface of the first connecting layer away from the substrate to the substrate in the thickness direction of the substrate.

In some embodiments of the present application, the distance from the surface of the insulating layer away from the substrate to the substrate in the thickness direction of the substrate is greater than a distance from a surface of the electrically conducting layer away from the substrate to the substrate in the thickness direction of the substrate.

In some embodiments of the present application, the insulating layer extends to apart of an area of the electrically conducting layer away from a surface of the substrate, and an orthographic projection of the insulating layer on the substrate and the orthographic projection of the electrically conducting layer on the substrate partially intersect or overlap.

In some embodiments of the present application, the orthographic projection of the first connecting layer on the substrate and the orthographic projection of the insulating layer on the substrate partially intersect or overlap.

In some embodiments of the present application, the orthographic projection of the insulating layer on the substrate and an orthographic projection of the electrically conducting layer on the substrate do not intersect or overlap with each other.

In some embodiments of the present application, an orthographic projection of the first connecting layer on the substrate and the orthographic projection of the insulating layer on the substrate do not intersect or overlap with each other.

In some embodiments of the present application, the array base plate further includes a plurality of second connecting layers and a plurality of element devices, the second connecting layers are located on one side of the first connecting layer away from the substrate, and orthographic projections of the second connecting layers on the substrate are located within the orthographic projection of the first connecting layer on the substrate;

the electrically conductive pads of one electrically-conductive-pad group are electrically connected to one element device by the second connecting layers; and a maximum thickness of the first connecting layer in the thickness direction of the substrate is greater than a maximum thickness of the second connecting layers in the thickness direction of the substrate.

In some embodiments of the present application, the maximum thickness of the first connecting layer in the thickness direction of the substrate is greater than or equal to two times of the maximum thickness of the second connecting layers in the thickness direction of the substrate.

In some embodiments of the present application, each of the element devices includes an element device body and at least one lead, the array base plate further includes a soldering layer located between the lead and the first connecting layer, and the soldering layer includes a soldering material; and in a predetermined condition, an extent of reaction between a material of the first connecting layer and a material of the soldering layer is less than an extent of reaction between a material of the electrically conducting layer and the material of the soldering layer.

In some embodiments of the present application, the array base plate includes a device disposing area and a bonding area that are located on the substrate;

the device disposing area includes the element devices, the electrically-conductive-pad groups and the second connecting layers; and the bonding area includes a circuit board, the electrically-conductive-pad groups and the second connecting layers, and the circuit board is electrically connected to the electrically-conductive-pad groups by the second connecting layers.

In some embodiments of the present application, a thickness of the first connecting layer within the device disposing area in the thickness direction of the substrate ranges 2 μm-5 μm; and a thickness of the first connecting layer within the bonding area in the thickness direction of the substrate ranges 2 μm-4 μm.

In some embodiments of the present application, a shape of an orthographic projection of each of the element devices on the substrate includes a rectangle, and a length-width ratio of the rectangle ranges 1:1-1.5:1.

In some embodiments of the present application, each of the element devices includes at least four leads, a quantity of the leads is equal to a quantity of the electrically conductive pads in each of the electrically-conductive-pad groups, the leads of a same one element device are electrically connected to the electrically conductive pads of a same one electrically-conductive-pad group;

orthographic projections of the leads on the substrate are located within the orthographic projection of the first connecting layer on the substrate; and a minimum distance between any two neighboring leads of a same one element device is greater than or equal to 40 μm.

In some embodiments of the present application, a shape of an orthographic projection of each of the leads on the substrate includes any one of a polygon and a shape formed by a polygon and an arc; and both of two opposing faces of two neighboring leads of a same one element device are planes, and the two planes are parallel.

In some embodiments of the present application, all of spacings between every two neighboring leads are equal.

In some embodiments of the present application, areas of the two planes are equal.

In some embodiments of the present application, the first connecting layer includes a nickel layer and a gold layer, and the gold layer is located on one side of the nickel layer away from the substrate; and the second connecting layers extend throughout a part of an area of the gold layer and extend into the nickel layer.

In the second aspect, an embodiment of the present application provides a light emitting apparatus, wherein the light emitting apparatus includes the array base plate stated above.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the prior art, the figures that are required to describe the embodiments or the prior art will be briefly described below. Apparently, the figures that are described below are merely embodiments of the present application, and a person skilled in the art can obtain other figures according to these figures without paying creative work.

FIGS. 4-16 are schematic structural diagrams of thirteen types of different array base plates according to the embodiments of the present application;

FIG. 20A and FIG. 20B are comparison diagrams of the structures of the element devices in the related art and the element devices according to an embodiment of the present application, wherein FIG. 20A is a schematic structural diagram of the element devices according to the present application, and FIG. 20B is a schematic structural diagram of the element devices in the related art;

FIG. 25A and FIG. 25B are schematic diagrams of the comparison between the dipping amounts of the soldering flux of the element devices in the related art and the element devices according to an embodiment of the present application, wherein FIG. 25A is a schematic diagram of the dipping amount of the soldering flux of the element devices according to the present application, and FIG. 25B is a schematic diagram of the dipping amount of the soldering flux of the element devices in the related art.

DETAILED DESCRIPTION

Figure 1:
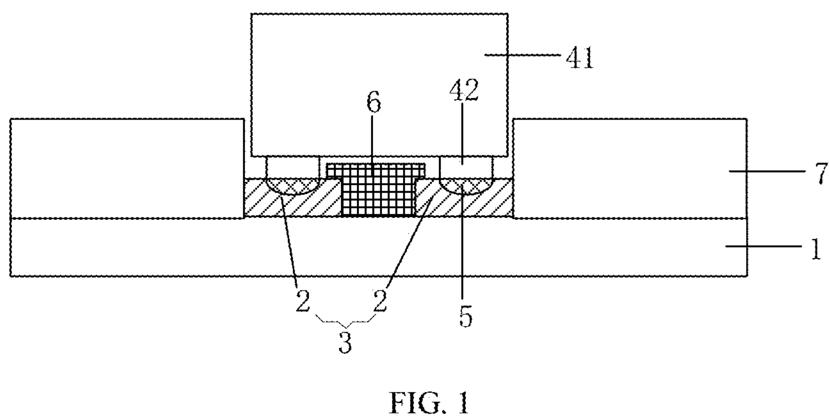
FIGS. 1-3 are schematic structural diagrams of the array base plates in three types of the related art.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the drawings, in order for clarity, the thicknesses of the areas and the layers might be exaggerated. In the drawings, the same reference numbers represent the same or similar components, and therefore the detailed description on them are omitted. Moreover, the drawings are merely schematic illustrations of the present disclosure, and are not necessarily drawn to scale.

In the embodiments of the present application, unless stated otherwise, the meaning of “plurality of” is “two or more”. The terms that indicate orientation or position relations, such as “upper”, are based on the orientation or position relations shown in the drawings, and are merely for conveniently describing the present application and simplifying the description, rather than indicating or implying that the component or element must have the specific orientation and be constructed and operated according to the specific orientation. Therefore, they should not be construed as a limitation on the present application.

Unless stated otherwise in the context, throughout the description and the claims, the term “comprise” is interpreted as the meaning of opened containing, i.e., “including but not limited to”. In the description of the present disclosure, the terms “one embodiment”, “some embodiments”, “exemplary embodiments”, “example”, “specific example” or “some examples” are intended to indicate that specific features, structures, materials or characteristics related to the embodiment or example are comprised in at least one embodiment or example of the present application. The illustrative indication of the above terms does not necessarily refer to the same one embodiment or example. Moreover, the specific features, structures, materials or characteristics may be comprised in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

Figure 4:
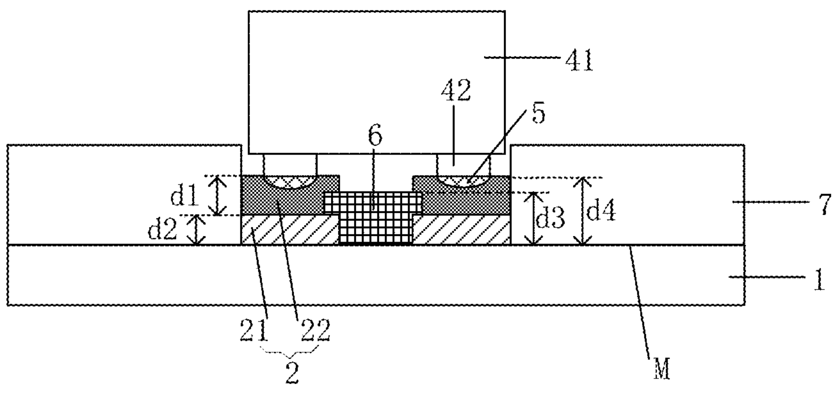

An embodiment of the present application provides an array base plate. Referring to FIG. 4, the array base plate includes:

a substrate 1; and a plurality of electrically-conductive-pad groups 3 located on the substrate 1, wherein each of the electrically-conductive-pad groups 3 includes at least one electrically conductive pad 2.

The electrically conductive pad 2 includes an electrically conducting layer 21 and a first connecting layer 22, the first connecting layer 22 is located on one side of the electrically conducting layer 21 away from the substrate 1, and the orthographic projection of the first connecting layer 22 on the substrate 1 and the orthographic projection of the electrically conducting layer 21 on the substrate 1 at least partially intersect or overlap.

The thickness d1 of the first connecting layers 22 in the thickness direction of the substrate 1 is greater than or equal to the thickness d2 of the electrically conducting layer 21 in the thickness direction of the substrate 1.

It should be noted that the thickness direction of the substrate 1 refers to that, referring to FIG. 4, the substrate 1 has a surface M close to the electrically conductive pads 2, and the direction perpendicular to the surface M may be understood as the thickness direction of the substrate 1. The meaning of the relevant description on the thickness direction of the substrate related to below is similar to that, and is not discussed further.

The quantity of the electrically conductive pads included in each of the electrically-conductive-pad groups 3 is not limited herein. The quantity of the electrically conductive pads included in each of the electrically-conductive-pad groups 3 may be an even number, or the quantity of the electrically conductive pads included in each of the electrically-conductive-pad groups 3 may be an odd number.

When the quantity of the electrically conductive pads included in each of the electrically-conductive-pad groups 3 is an even number, a half of the electrically conductive pads in the same one electrically-conductive-pad group 3 may be connected to the positive electrodes of the element devices, and the other half of the electrically conductive pads may be connected to the negative electrodes of the element devices.

As an example, the electrically-conductive-pad group 3 may include two electrically conductive pads. Alternatively, the electrically-conductive-pad group 3 may include four electrically conductive pads. Alternatively, the electrically-conductive-pad group 3 may include six electrically conductive pads. Alternatively, the electrically-conductive-pad group 3 may include eight electrically conductive pads.

As an example, each of the electrically conductive pads includes an electrically conducting bonding pad or a connecting electrode.

Figure 11:
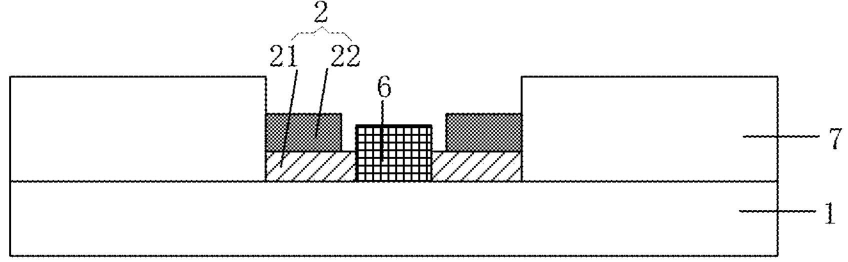
Figure 13:
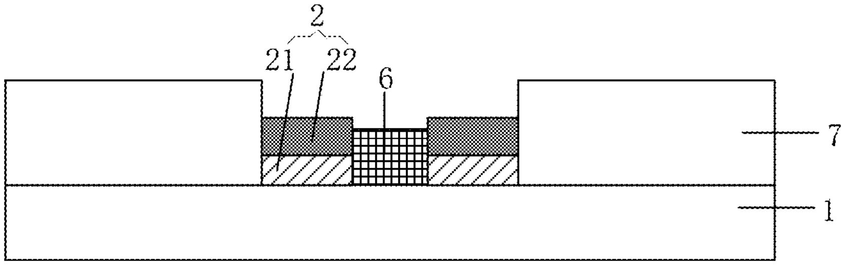
Figure 14:
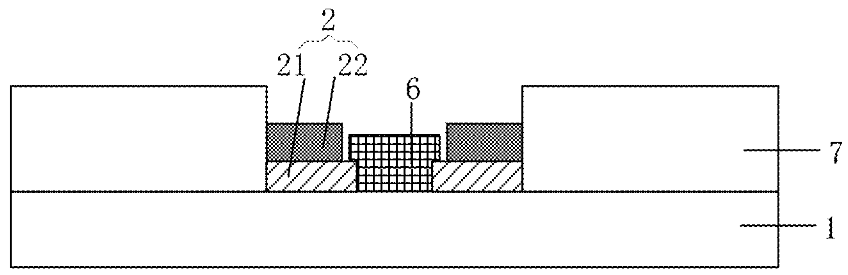
Figure 15:
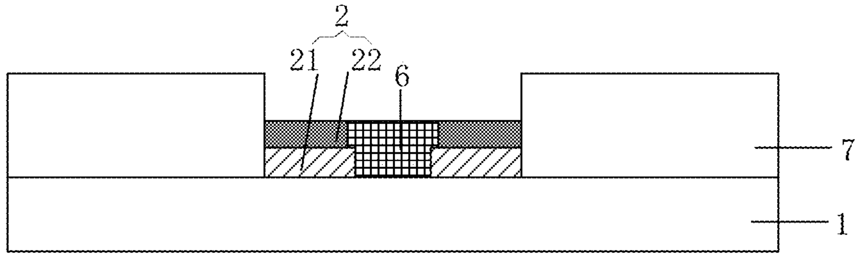

In an exemplary embodiment, that the orthographic projection of the first connecting layer 22 on the substrate 1 and the orthographic projection of the electrically conducting layer 21 on the substrate 1 at least partially intersect or overlap means that, referring to FIG. 11, 14 or 15, the orthographic projection of the first connecting layer 22 on the substrate 1 and the orthographic projection of the electrically conducting layer 21 on the substrate 1 partially intersect or overlap. Alternatively, referring to FIG. 4, FIG. 12, FIG. 13 or FIG. 16, the orthographic projection of the first connecting layer 22 on the substrate 1 and the orthographic projection of the electrically conducting layer 21 on the substrate 1 completely intersect or overlap, in which case it can be understood that the outer contour of the orthographic projection of the first connecting layer 22 on the substrate 1 and the outer contour of the orthographic projection of the electrically conducting layer 21 on the substrate 1 intersect or overlap.

In an exemplary embodiment, each of the electrically conducting layer 21 and the first connecting layer 22 includes an electrically conductive material.

It is not limited herein whether the materials of the electrically conducting layer 21 and the first connecting layer 22 are the same. As an example, the materials of the electrically conducting layer 21 and the first connecting layer 22 are different.

In an exemplary embodiment, both of the materials of the electrically conducting layer 21 and the first connecting layer 22 are solderable materials, and the solderability of the material of the first connecting layer 22 is less than the solderability of the material of the electrically conducting layer 21. It should be noted that, if the solderability of a material is higher, in reflow soldering, the material has a higher extent of reaction with the soldering material, and the consumption of the material of the film layer is higher.

As an example, the solderability of the material of the electrically conducting layer 21 is higher than the solderability of the material of the first connecting layer 22, and as compared with the consumption on the first connecting layer 22 by the reaction between the soldering material and the first connecting layer 22, the consumption on the electrically conducting layer 21 by the reaction between the soldering material and the electrically conducting layer 21 is higher.

As an example, the material of the electrically conducting layer 21 is copper, and the material of the first connecting layer 22 includes nickel and/or gold.

In an exemplary embodiment, the array base plate may include a double-layer trace layer. Referring to FIG. 7 or 8, the array base plate includes a first trace layer 101 and a second trace layer 102, and the first trace layer 101 and the second trace layer 102 together form the electrically conducting pattern of the array base plate. The electrically conducting layer 21 in the electrically conductive pad 2 is located in the second trace layer 102. It can be understood that the electrically conducting layer 21 in the electrically conductive pad 2 is a part of the second trace layer 102, in which case the electrically conductive pad 2 includes the electrically conducting layer 21 and the first connecting layer 22.

Figure 10:
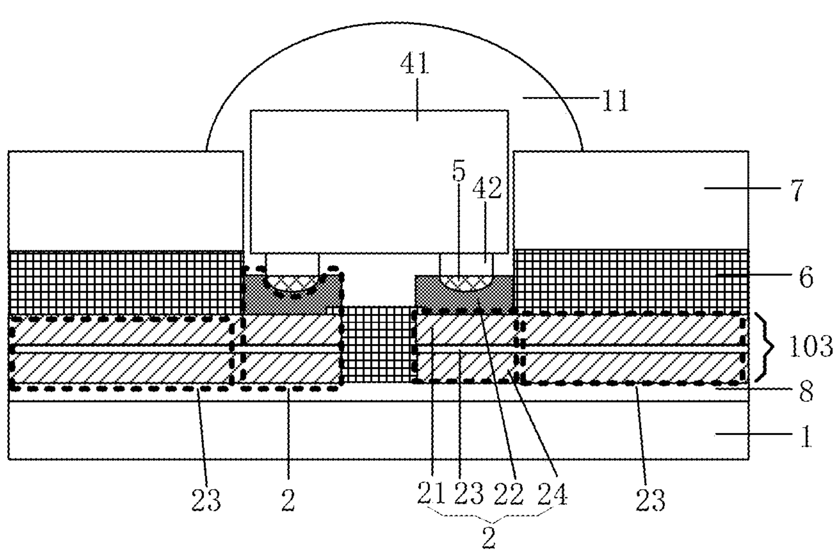

In an exemplary embodiment, the array base plate may include a single-layer trace layer. As shown in FIG. 9 or 10, the array base plate includes a third trace layer 103, and the third trace layer 103 is used to form the electrically conducting pattern of the array base plate. The third trace layer

103 may include a copper metal layer, a molybdenum-niobium-alloy layer and a copper metal layer that are arranged in layer configuration. Alternatively, the third trace layer 103 may include a copper metal layer, a molybdenum-niobium-alloy layer, a copper metal layer, a molybdenum-niobium-alloy layer and a copper metal layer that are arranged in layer configuration. The electrically conducting layer 21 in the electrically conductive pad 2 is located at the copper metal layer on one side of the third trace layer 103 away from the substrate 1. It can be understood that the electrically conducting layer 21 in the electrically conductive pad 2 is the part of the copper metal layer as shown in FIG. 9 or 10 that contacts the first connecting layer 22, in which case, taking the structure shown in FIG. 9 as an example, the electrically conductive pad 2 may include a part of a copper metal layer 24, a part of a molybdenum-niobium-alloy layer 23, the electrically conducting layer 21 and the first connecting layer 22.

In an exemplary embodiment, the electrically conductive pad 2 may include the electrically conducting layer 21 and the first connecting layer 22, and may further include other electrically conducting film layers located on one side of the electrically conducting layer 21 away from the first connecting layer 22, for example, the part of a copper metal layer 24 and the part of a molybdenum-niobium-alloy layer 23 shown in FIG. 9, which may be particularly determined according to particular situations, and is not limited herein.

In an exemplary embodiment, the thickness d1 of the first connecting layers 22 in the thickness direction of the substrate 1 ranges 2 μm-5 μm.

In an exemplary embodiment, the thickness d2 of the electrically conducting layers 21 in the thickness direction of the substrate 1 ranges 0.5 μm-2 μm.

In the related art, referring to FIG. 1, the leads 42 of the element device and the electrically conductive pads 2 (the electrically conducting layers 21) are soldered together by reflow soldering. In the soldering, a soldering material (not shown in the figure) is disposed between the leads 42 of the element device and the electrically conductive pads 2, the soldering material and the material of the electrically conductive pads 2 (the electrically conducting layers 21) react at a high temperature, an inter-metal-layer compound is generated at the interface between the leads 42 and the electrically conductive pads 2 (the electrically conducting layers 21), and the inter-metal-layer compound accumulated together forms the second connecting layers 5 to fix the leads 42 of the element device and the electrically conductive pads 2 (the electrically conducting layers 21) together.

Figure 2:
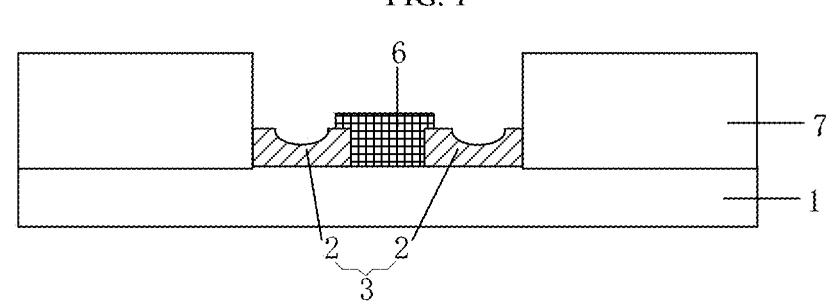
Figure 3:
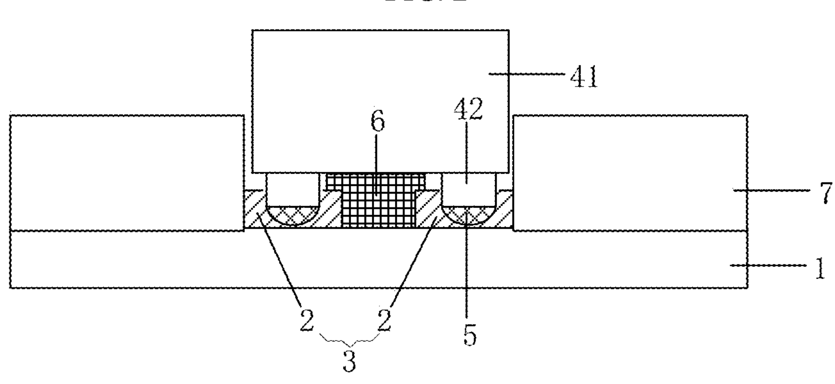

In practical applications, when an element device is abnormal, in the rework of the array base plate, it is required to detach the element device. In this case, referring to FIG. 2, both of the element device and the second connecting layers 5 are stripped, and the surfaces of the electrically conductive pads 2 (the electrically conducting layers 21) of the array base plate away from the substrate 1 have concaves, whereby the minimum thickness of the electrically conductive pads 2 (the electrically conducting layers 21) in the thickness direction of the substrate 1 is very low. When the element device is being re-soldered, the soldering material and the material of the remaining electrically conductive pads 2 (the electrically conducting layers 21) react at a high temperature, to re-generate the second connecting layers 5 shown in FIG. 3, and the surfaces of the second connecting layers 5 that are close to the substrate 1 and there is a low distance between the surfaces of the electrically conductive pads 2 (the electrically conducting layers 21) that are close to the substrate 1. Accordingly, the electrically conductive pads 2 (the electrically conducting layers 21) have a very high risk of cracking, which reduces the rework yield of the array base plate.

In the embodiments of the present application, referring to FIG. 4, by configuring that the electrically conductive pads 2 include the electrically conducting layers 21 and the first connecting layers 22, the soldering material and the material of the first connecting layers 22 of the electrically conductive pads 2 react at a high temperature, an inter-metal-layer compound is generated at the interface between the leads 42 and the first connecting layers 22, the inter-metal-layer compound accumulated together forms the second connecting layers 5, and the second connecting layers 5 fix the leads 42 of the element device and the electrically conductive pads 2 together. After an element device is abnormal and the element device has been detached, referring to FIG. 5, both of the element device and the second connecting layers 5 are stripped, and the surfaces of the first connecting layers 22 of the electrically conductive pads 2 of the array base plate away from the substrate 1 have concaves. When the element device is being re-soldered, the soldering material and the material of the remaining first connecting layers 22 react at a high temperature, to re-generate the second connecting layers 5 shown in FIG. 6, whereby the first connecting layers 22 serve to protect the electrically conducting layers 21, to prevent cracking of the electrically conductive pads 2, thereby increasing the repairing yield of the array base plate.

In some embodiments of the present application, referring to FIG. 4, each of the electrically-conductive-pad groups 3 includes at least two electrically conductive pads, the array base plate further includes an insulating layer 6, and the insulating layer 6 is located between the electrically conductive pads 2 of the same one electrically-conductive-pad group 3.

The distance d3 from the surface of the insulating layer 6 away from the substrate 1 to the substrate 1 in the thickness direction of the substrate 1 is less than or equal to the distance d4 from the surface of the first connecting layer 22 away from the substrate 1 to the substrate 1 in the thickness direction of the substrate 1.

In the related art, referring to FIG. 1, because the surface of the insulating layer 6 between the electrically conductive pads 2 of the same one electrically-conductive-pad group 3 away from the substrate 1 is higher than the surfaces of the electrically conductive pads 2 away from the substrate, in the process of connecting the element device to the electrically conductive pads, the insulating layer 6 bears the element device, which very easily causes dislocation between the leads of the element device and the corresponding electrically conductive pads or loose connection between the leads of the element device and the corresponding electrically conductive pads, thereby resulting in switching-on imperfects.

In the embodiments of the present application, referring to FIGS. 4 and 11-16, by configuring that the distance d3 from the surface of the insulating layer 6 away from the substrate 1 to the substrate 1 in the thickness direction of the substrate 1 is less than or equal to the distance d4 from the surface of the first connecting layers 22 away from the substrate 1 to the substrate 1 in the thickness direction of the substrate 1, the positions of the surfaces of the first connecting layers 22 of the electrically conductive pads 2 away from the substrate 1 can be higher than the position of the surface of the insulating layer 6 away from the substrate 1, whereby the leads of the element device more easily contact the first connecting layers 22 of the electrically conductive pads 2, which improves the switching-on stability between the leads of the element device and the electrically conductive pads 2, thereby improving the reliability of the array base plate.

In some embodiments of the present application, referring to FIGS. 11-16, the distance from the surface of the insulating layer 6 away from the substrate 1 to the substrate 1 in the thickness direction of the substrate 1 is greater than the distance from the surface of the electrically conducting layer 21 away from the substrate 1 to the substrate 1 in the thickness direction of the substrate 1.

In practical applications, after the electrically conducting layers 21 have been produced completely, the insulating layer 6 is disposed between the electrically conducting layers 21 of the same one electrically-conductive-pad group 3, to prevent short circuiting between the electrically conducting layers 21 of the same one electrically-conductive-pad group 3 in the subsequent process or the subsequent usage.

In the embodiments of the present application, by configuring that the upper surface of the insulating layer 6 is higher than the upper surfaces of the electrically conducting layers 21, two neighboring electrically conducting layers 21 and the first connecting layer 22 located between the two neighboring electrically conducting layers can form an uneven surface, and in the production of the first connecting layers 22, the first connecting layers 22 on the two neighboring electrically conducting layers 21 are not easily formed on the insulating layer 6, to prevent short circuiting between the two neighboring first connecting layers 22 of the same one electrically-conductive-pad group 3 in the subsequent process or the subsequent usage.

Figure 16:
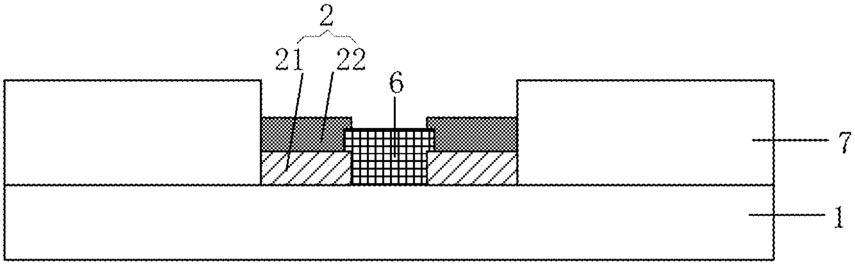

Additionally, it should be noted that, referring to FIG. 16, even if the orthographic projections of the first connecting layers 22 on the substrate 1 and the edge areas of the orthographic projections of the insulating layers 6 on the substrate 1 partially intersect or overlap, because the upper surface of the insulating layer 6 is higher than the upper surfaces of the electrically conducting layers 21, when the first connecting layers 22 are formed, the first connecting layers 22 are subjected to an internal stress at the climbing positions of the side surfaces of the insulating layer 6, which causes that the two neighboring first connecting layers 22 are difficult to cover the upper surface of the insulating layer 6 and be connected together, thereby preventing short circuiting between the two neighboring first connecting layers 22 of the same one electrically-conductive-pad group 3 in the subsequent process or the subsequent usage, to improve the reliability of the array base plate.

Figure 12:
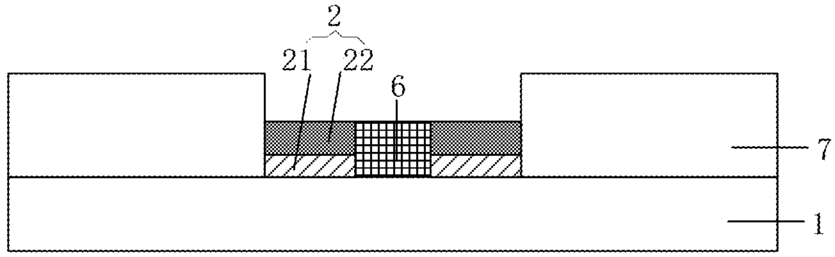

In some embodiments of the present application, referring to FIGS. 11, 12 and 13, the orthographic projection of the insulating layer 6 on the substrate 1 and the orthographic projections of the electrically conducting layers 21 on the substrate 1 do not intersect or overlap with each other.

In some embodiments of the present application, referring to FIGS. 11, 12 and 13, the orthographic projections of the first connecting layers 22 on the substrate 1 and the orthographic projection of the insulating layer 6 on the substrate 1 do not intersect or overlap with each other.

As an example, referring to FIG. 11, the outer contours of the orthographic projections of the first connecting layers 22 on the substrate 1 are located within the outer contours of the orthographic projections of the electrically conducting layers 21 on the substrate 1, a part of the outer contour of the orthographic projection of the insulating layer 6 on the substrate 1 and a part of the outer contours of the orthographic projections of the electrically conducting layers 21 on the substrate 1 are connected, and the outer contours of the orthographic projections of the first connecting layers 22 on the substrate 1 and the outer contour of the orthographic projection of the insulating layer 6 on the substrate 1 do not contact each other. It can be understood that, in this case, gaps exist between the first connecting layers 22 and the insulating layer 6.

As an example, referring to FIGS. 12 and 13, the outer contours of the orthographic projections of the first connecting layers 22 on the substrate 1 and the outer contours of the orthographic projections of the electrically conducting layers 21 on the substrate 1 overlap, and a part of the outer contour of the orthographic projection of the insulating layer 6 on the substrate 1 and a part of the outer contours of the orthographic projections of the electrically conducting layers 21 on the substrate 1 are connected.

In some embodiments of the present application, referring to FIGS. 14, 15 and 16, the insulating layer 6 extends to a part of an area of the electrically conducting layers 21 away from the surface of the substrate 1, and the orthographic projection of the insulating layer 6 on the substrate 1 and the orthographic projections of the electrically conducting layers 21 on the substrate 1 partially intersect or overlap.

In an exemplary embodiment, referring to FIG. 14, the insulating layer 6 extends to a part of the area of the electrically conducting layers 21 away from the surface of the substrate 1, the orthographic projection of the insulating layer 6 on the substrate 1 and the orthographic projections of the electrically conducting layers 21 on the substrate 1 partially intersect or overlap, the outer contours of the orthographic projections of the first connecting layers 22 on the substrate 1 are located within the outer contours of the orthographic projections of the electrically conducting layers 21 on the substrate 1, and the outer contours of the orthographic projections of the first connecting layers 22 on the substrate 1 and the outer contour of the orthographic projection of the insulating layer 6 on the substrate 1 do not contact each other. It can be understood that, in this case, gaps exist between the first connecting layers 22 and the insulating layer 6.

In an exemplary embodiment, referring to FIG. 15, the insulating layer 6 extends to a part of the area of the electrically conducting layers 21 away from the surface of the substrate 1, the orthographic projection of the insulating layer 6 on the substrate 1 and the orthographic projections of the electrically conducting layers 21 on the substrate 1 partially intersect or overlap, the outer contours of the orthographic projections of the first connecting layers 22 on the substrate 1 are located within the outer contours of the orthographic projections of the electrically conducting layers 21 on the substrate 1, and a part of the outer contours of the orthographic projections of the first connecting layers 22 on the substrate 1 and a part of the outer contour of the orthographic projection of the insulating layer 6 on the substrate 1 are connected.

In some embodiments of the present application, referring to FIG. 16, the insulating layer 6 extends to a part of the area of the electrically conducting layers 21 away from the surface of the substrate 1, the orthographic projection of the insulating layer 6 on the substrate 1 and the orthographic projections of the electrically conducting layers 21 on the substrate 1 partially intersect or overlap, the first connecting layers 22 extend to a part of the area of the insulating layer 6 away from the surface of the substrate 1, and the orthographic projections of the first connecting layers 22 on the substrate 1 and the orthographic projection of the insulating layer 6 on the substrate 1 partially intersect or overlap.

In the embodiments of the present application, the insulating layer 6 extends to a part of the area of the electrically conducting layers 21 away from the surface of the substrate 1, and the orthographic projection of the insulating layer 6 on the substrate 1 and the orthographic projections of the electrically conducting layers 21 on the substrate 1 partially intersect or overlap. However, because the upper surface of the insulating layer 6 is higher than the upper surfaces of the electrically conducting layers 21, when the first connecting layers 22 are formed, the first connecting layers 22 are subjected to an internal stress at the climbing positions of the side surfaces of the insulating layer 6, which causes that the two neighboring first connecting layers 22 are difficult to cover the upper surface of the insulating layer 6 and be connected together, thereby preventing short circuiting between the two neighboring first connecting layers 22 of the same one electrically-conductive-pad group 3 in the subsequent process or the subsequent usage, to improve the reliability of the array base plate.

In some embodiments of the present application, referring to FIG. 7, the array base plate further includes a plurality of second connecting layers 5 and a plurality of element devices (including an element device body 41 and a lead 42), the second connecting layers 5 are located on one side of the first connecting layers 22 away from the substrate 1, and the orthographic projections of the second connecting layers 5 on the substrate 1 are located within the orthographic projections of the first connecting layers 22 on the substrate 1. The electrically conductive pads 2 of one electrically-conductive-pad group 3 are electrically connected to one element device by the second connecting layers 5.

The maximum thickness d6 of the first connecting layers 22 in the thickness direction of the substrate 1 is greater than the maximum thickness d5 of the second connecting layers 5 in the thickness direction of the substrate 1.

In an exemplary embodiment, the element devices include a driving chip and/or a light emitting chip.

As an example, the light emitting chip may include a Mini Light Emitting Diode (referred to for short as Mini LED) or a Micro Light Emitting Diode (referred to for short as Micro LED).

The size of the Mini LED ranges 100 μm-300 μm, and the size of the Micro LED ranges 0 μm-100 μm.

In an exemplary embodiment, that the orthographic projections of the second connecting layers 5 on the substrate 1 are located within the orthographic projections of the first connecting layers 22 on the substrate 1 means that the outer contours of the orthographic projections of the second connecting layers 5 on the substrate 1 are located within the outer contours of the orthographic projections of the first connecting layers 22 on the substrate 1.

In an exemplary embodiment, the element device is electrically connected to the electrically conductive pads 2 by the second connecting layers 5, and the second connecting layers 5 include an inter-metal-layer compound.

Figure 5:
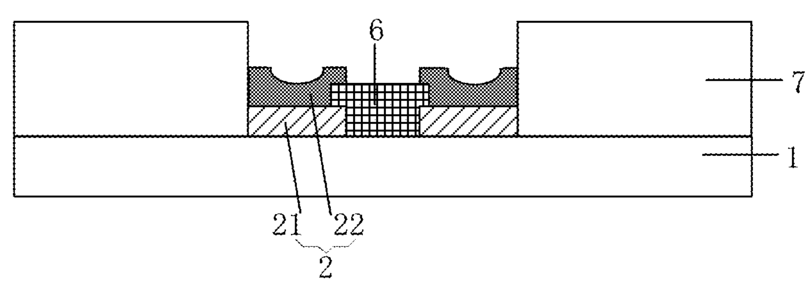
Figure 6:
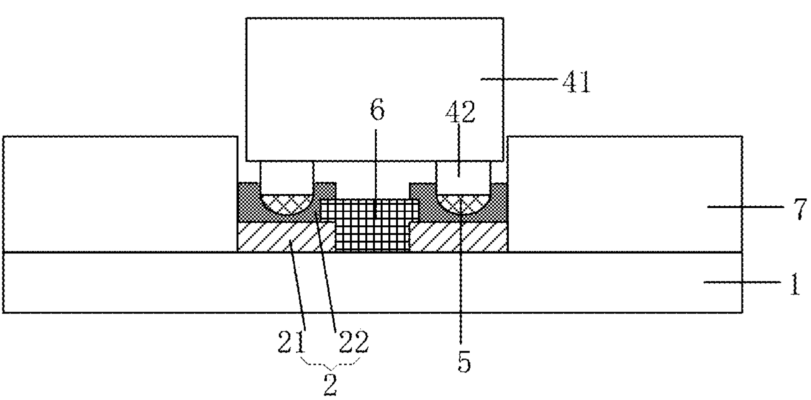

In practical applications, when the element device and the electrically conductive pads are being soldered, the soldering material and the material of the electrically conductive pads 2 react at a high temperature, to form the second connecting layers 5 formed by the inter-metal-layer compound. When an element device is abnormal and is to be repaired, it is required to detach the element device. Referring to FIG. 5, both of the element device and the second connecting layers 5 are stripped, and the surfaces of the first connecting layers 22 of the electrically conductive pads 2 of the array base plate away from the substrate 1 have concaves. Because the maximum thickness d6 of the first connecting layers 22 in the thickness direction of the substrate 1 is greater than the maximum thickness d5 of the second connecting layers 5 in the thickness direction of the substrate 1, when the element device is being re-soldered, the soldering material and the material of the remaining first connecting layers 22 react at a high temperature, to re-generate the second connecting layers 5 shown in FIG. 6, whereby the first connecting layers 22 serve to protect the electrically conducting layers 21, to prevent cracking of the electrically conductive pads 2.

Additionally, when the element device is being re-soldered, the soldering material might, after reacting with the material of the remaining first connecting layers 22, continue to pass through the first connecting layers 22 and react with the electrically conducting layers 21, to re-generate the second connecting layers 5. In this case, the second connecting layers 5 are located between the first connecting layers 22 and the electrically conducting layers 21, but, because the soldering material reacts with the material of the surfaces of the electrically conducting layers 21 away from the substrate 1, which consumes the material of the electrically conducting layers 21 to a low extent, the major structure of the electrically conducting layers 21 is reserved, and the first connecting layers 22 still serve to protect the electrically conducting layers 21, to prevent cracking of the electrically conductive pads 2.

In some embodiments of the present application, the maximum thickness d6 of the first connecting layers 22 in the thickness direction of the substrate 1 is greater than or equal to two times of the maximum thickness d5 of the second connecting layers 5 in the thickness direction of the substrate 1.

In the embodiments of the present application, when the element device and the electrically conductive pads are being soldered, the soldering material and the material of the electrically conductive pads 2 react at a high temperature, to form the second connecting layers 5 formed by an inter-metal-layer compound. When an element device is abnormal and is to be repaired, it is required to detach the element device. Referring to FIG. 5, both of the element device and the second connecting layers 5 are stripped, and the surfaces of the first connecting layers 22 of the electrically conductive pads 2 of the array base plate away from the substrate 1 have concaves. Because the maximum thickness d6 of the first connecting layers 22 in the thickness direction of the substrate 1 is greater than or equal to two times of the maximum thickness d5 of the second connecting layers 5 in the thickness direction of the substrate 1, when the element device is being re-soldered, the soldering material and the material of the remaining first connecting layers 22 react at a high temperature, and do not penetrate the first connecting layers 22 (even if it penetrates the first connecting layers 22, it does not further react with the electrically conducting layers 21), to generate the second connecting layers 5 shown in FIG. 6, whereby the first connecting layers 22 serve to protect the electrically conducting layers 21, to prevent cracking of the electrically conductive pads 2.

In an exemplary embodiment, the thickness of the second connecting layers 5 formed by the reaction between the soldering material and the material of the first connecting layer 22 at a high-temperature is 1 μm±0.3 μm.

In some embodiments of the present application, each of the element devices includes an element device body 41 and at least one lead 42, the array base plate further includes a soldering layer (not shown) located between the lead 42 and the first connecting layer 22, and the soldering layer includes a soldering material.

As an example, the soldering material includes a soldering paste.

As an example, the soldering material includes SnAgCu, wherein the tin content is 97%.

In a predetermined condition, the extent of reaction between the material of the first connecting layer and the material of the soldering layer is less than the extent of reaction between the material of the electrically conducting layer and the material of the soldering layer.

As an example, the predetermined condition refers to the process of reflow soldering.

As an example, the materials of the electrically conducting layer 21 and the first connecting layer 22 are different.

In an exemplary embodiment, that the extent of reaction between the material of the first connecting layer 22 and the material of the soldering layer is less than the extent of reaction between the material of the electrically conducting layer 21 and the material of the soldering layer means that the solderability of the material of the first connecting layer 22 is less than the solderability of the material of the electrically conducting layer 21. It should be noted that, if the solderability of a material is higher, in reflow soldering, the material has a higher extent of reaction with the soldering material, and the consumption of the material of the film layer is higher.

As an example, the solderability of the material of the electrically conducting layer 21 is higher than the solderability of the material of the first connecting layer 22, and as compared with the consumption on the first connecting layer 22 by the reaction between the soldering material and the first connecting layer 22, the consumption on the electrically conducting layer 21 by the reaction between the soldering material and the electrically conducting layer 21 is higher.

As an example, the material of the electrically conducting layer 21 includes copper, and the material of the first connecting layer 22 includes nickel and/or gold.

In the embodiments of the present application, because the extent of reaction between the material of the first connecting layer 22 and the material of the soldering layer is less than the extent of reaction between the material of the electrically conducting layer 21 and the material of the soldering layer, as compared with the mode of directly increasing the thickness of the electrically conducting layers 21 to prevent cracking of the electrically conductive pads during the repairing process, the first connecting layers 22 of the equal thickness (the increased thickness of the electrically conducting layers 21) can better contain the original electrically conducting layers 21, to prevent cracking of the electrically conductive pads 2. In addition, from the perspective of the producing process, the difficulty in the process of producing the first connecting layers 22 is far lower than that of producing the electrically conducting layers 21 of a higher thickness.

In some embodiments of the present application, the array base plate includes a device disposing area and a bonding area that are located on the substrate.

The device disposing area includes the element devices, the electrically-conductive-pad groups 3 and the second connecting layers.

The bonding area includes a circuit board (FPC), the electrically-conductive-pad groups 3 and the second connecting layers, and the circuit board is electrically connected to the electrically-conductive-pad groups 3 by the second connecting layers.

It should be noted that the device disposing area refers to the area where the element devices (the light emitting elements) are disposed. Regarding the light emitting apparatus produced by using the array base plate, the device disposing area is the effective light emitting area of the light emitting apparatus, and the bonding area is the area at the periphery of the light emitting area where the circuit board is disposed.

In some embodiments of the present application, the thickness of the first connecting layer 22 within the device disposing area in the thickness direction of the substrate 1 ranges 2 μm-5 μm. As an example, the thickness of the first connecting layer 22 within the device disposing area in the thickness direction of the substrate 1 may be 2 μm, 2.5 μm, 3 μm, 3.5 μm, 4 μm or 5 μm.

In the embodiments of the present application, comprehensively taking into consideration the fluctuation in the process of producing the first connecting layers 22 and the influence on the first connecting layers 22 by the removal of the element devices in the repairment of the array base plate, the minimum thickness of the first connecting layers 22 in the thickness direction of the substrate 1 may be 2 μm. Additionally, if the thickness of the first connecting layers 22 in the thickness direction of the substrate 1 is higher, the effect of protecting the electrically conducting layers 2 is better, but the difficulty and the cost of the producing process are increased.

In some embodiments of the present application, the thickness of the first connecting layer 22 within the bonding area in the thickness direction of the substrate 1 ranges 2 μm-4 μm. As an example, the thickness of the first connecting layer 22 within the bonding area in the thickness direction of the substrate 1 may be 2 μm, 2.5 μm, 3 μm, 3.5 μm or 4 μm.

In the embodiments of the present application, comprehensively taking into consideration the fluctuation in the process of producing the first connecting layers 22 and the influence on the first connecting layers 22 by the removal of the element devices in the repairment of the array base plate, the minimum thickness of the first connecting layers 22 in the thickness direction of the substrate 1 may be 2 μm. Additionally, in the bonding area, as influenced by the producing process of the circuit board, if the thickness of the first connecting layers 22 in the thickness direction of the substrate 1 is higher, the internal stress that might exist between the circuit board and the film layers is higher, and the risk of stripping of the circuit board after the bonding is higher. Therefore, the maximum thickness of the first connecting layers 22 within the bonding area in the thickness direction of the substrate 1 is set to be 4 μm.

Figure 17:
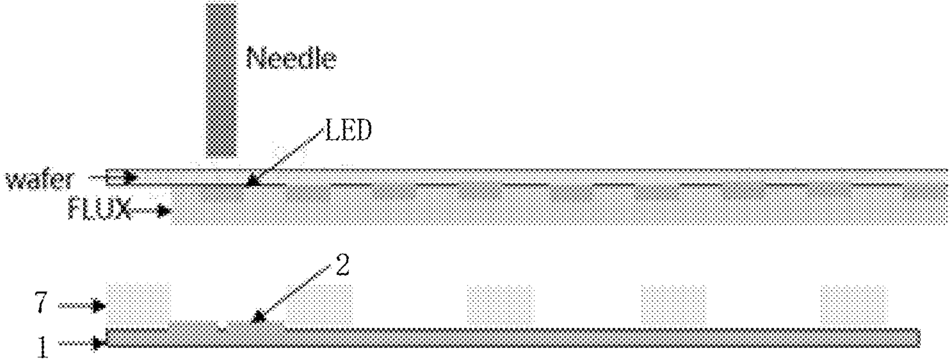
FIG. 17 is a schematic diagram of the process of the needling die bonding according to an embodiment of the present application.

In the related art, referring to FIG. 17, when the element device (FIG. 17 illustrates by taking the case as an example in which the element device is an LED chip) and the electrically conductive pads 2 are being soldered together, firstly the element device is placed over the electrically-conductive-pad groups 2 by needling die bonding, wherein the side of the element device close to the substrate 1 of the array base plate is provided with a soldering flux (Flux), and the surfaces of the leads of the element device or the surfaces of the electrically conductive pads are coated with the soldering material. By the process of reflow soldering, the electrically conductive pads and the element device are soldered together.

Figure 18:
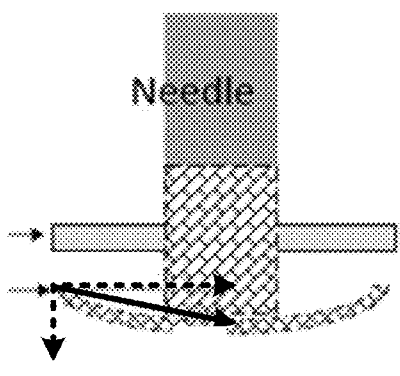
FIGS. 18 and 19 are schematic diagrams of the force analysis of the element device in the needling die bonding according to FIG. 17.
Figure 19:
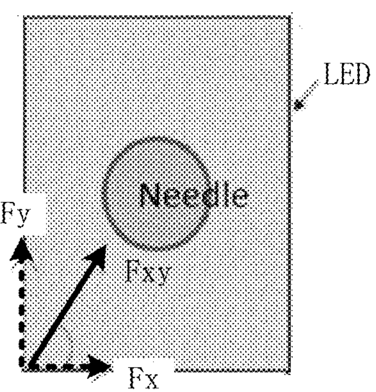

In practical applications, referring to FIG. 18, by the effect of the needle, the element device (LED) descends and slightly deforms, wherein the middle area of the element device depresses, and the edge area upwarps. Accordingly, in the process of the needling die bonding, the element device is subjected to a centripetal force F shown in FIG. 18. The centripetal force F may be resolved into the force Fxy in the horizontal direction and the force Fy in the vertical direction. Referring to FIG. 19, in the horizontal direction, the force Fxy may be resolved into the force Fx in the x direction and the force Fy in the y direction, wherein the direction of the force Fx and the direction of the force Fy are along the longer sides and the shorter sides of the element device (LED) respectively. All of the shapes of the orthographic projections of the element devices (for example, LED chips) in the related art on the substrate are long strip shape. Therefore, the acting forces exerted on the longer sides and the shorter sides of the long strip-shape element devices are different, and when the longer sides and the shorter sides are highly different and the acting forces exerted on them are highly different, the element devices easily rotate in the process of die bonding, whereby the leads of the element devices and the electrically conductive pads are dislocated, which results in switching-on imperfects between the element devices and the electrically conductive pads.

In view of that, in some embodiments of the present application, the shape of the orthographic projection of each of the element devices on the substrate 1 includes a rectangle, and the length-width ratio of the rectangle ranges 1:1-1.5:1. As an example, the length-width ratio of the rectangle may be 1:1, 1.1:1, 1:2, 1.3:1, 1:4 and 1.5:1.

As an example, the length-width ratio of the shape of the orthographic projection of each of the element devices on the substrate 1 is 1:1, and the shape of the orthographic projection of each of the element devices on the substrate 1 is a square.

In the embodiments of the present application, by configuring that the shape of the orthographic projection of the element device on the substrate 1 includes a rectangle, and the length-width ratio of the rectangle ranges 1:1-1.5:1, the difference between the acting forces exerted on the longer sides and the shorter sides of the element device shown in FIG. 19 can be reduced, and the probability that the element device easily rotates in the process of die bonding can be reduced, thereby ameliorating the problem of dislocation between the leads and the electrically conductive pads of the element device in the die bonding, to ameliorate the problem of switching-on imperfects between the element device and the electrically conductive pads.

The probability that the element device rotates in the process of die bonding according to the embodiments of the present application may be as low as 5%, which is far less than the probability 52% that the element device rotates in the process of die bonding in the related art.

Additionally, in die bonding, a certain amount of a soldering flux (Flux) is dipped by the element device, and the soldering flux is dipped around the leads of the element device. In practical applications, the amount of the soldering flux dipped by one element device is related to the contacting area between the leads of the element device and the soldering flux and the distance between two neighboring leads. When the amount of the soldering flux dipped by the element device is insufficient or the soldering flux is distributed ununiformly, the problem of soldering imperfects also easily emerges.

Figure 20:
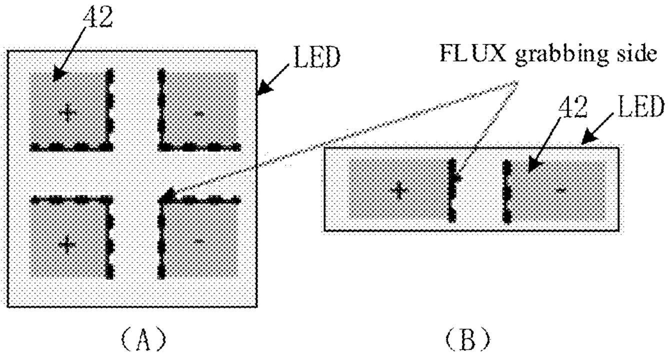

FIG. 20A and FIG. 20B provide comparison diagrams of the structures of the element devices in the related art (FIG. 20A) and the element devices according to an embodiment of the present application (FIG. 20B).

In practical applications, after the element device has been dipped with the soldering flux, it is lifted from the container of the soldering flux, and the dipping amount between the opposing faces of the leads is subjected to a friction by the two opposing faces (the faces of the dotted lines at the surfaces in FIG. 20A and FIG. 20B), whose stability is superior to that of the faces of the leads close to the edges of the element device. Therefore, the amount of the soldering flux between the opposing faces of the leads can be quantized and estimated, and by adjusting the parameters (the dipping duration and the lifting speed) of the dipping device, an effective dipping during grabbing is realized, thereby quantizing the amount of the soldering flux.

In some embodiments of the present application, each of the element devices includes at least four leads 42, the quantity of the leads 42 is equal to the quantity of the electrically conductive pads 2 in each of the electrically-conductive-pad groups 3, the leads 42 of the same one element device are electrically connected to the electrically conductive pads 2 of the same one electrically-conductive-pad group 3. The orthographic projections of the leads 42 on the substrate 1 are located within the orthographic projections of the first connecting layers 22 on the substrate 1. The minimum distance between any two neighboring leads 42 of the same one element device is greater than or equal to 40 μm.

Figure 22:
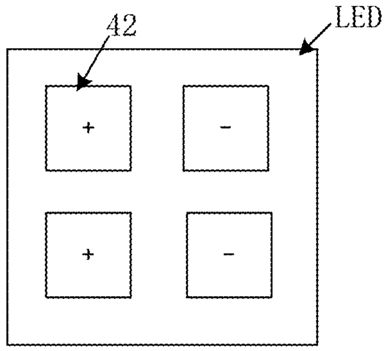
Figure 23:
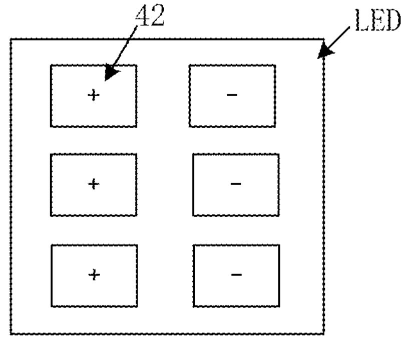
Figure 24:
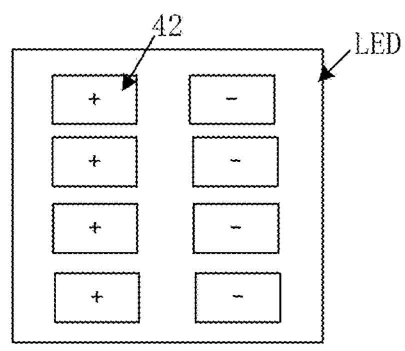

As an example, the quantity of the leads of one element device may be an even number. For example, the quantity of the leads of one element device may be 4, as shown in FIG. 22. Alternatively, the quantity of the leads of one element device may be 6, as shown in FIG. 23. Alternatively, the quantity of the leads of one element device may be 8, as shown in FIG. 24.

The shape of the orthographic projections of the leads of the element devices on the substrate is not limited herein. For example, the shape of the orthographic projections of the leads on the substrate may include an arc, a polygon or a shape formed by an arc and a polygon.

As an example, the shape of the orthographic projections of the leads on the substrate may be a rectangle.

As an example, the shape of the orthographic projections of the leads on the substrate may be a circle.

In an exemplary embodiment, each of the element devices includes four leads 42. Referring to FIG. 20A, two leads of the four leads are anode leads, the other two leads are cathode leads, the four leads are evenly distributed, and two opposing faces of two neighboring leads are parallel. Accordingly, the maximum distance and the minimum distance between two neighboring leads are equal.

In an exemplary embodiment, by comparing FIG. 20B and FIG. 20A, the effective dipping faces in FIG. 20A are eight, and the effective dipping faces in FIG. 20B are two. When the side lengths of the marked sides in FIG. 20B and FIG. 20A are equal and the heights of the leads are equal, the area of the effective dipping faces in FIG. 20A is significantly greater than the area of the effective dipping faces in FIG. 20B.

Figure 25:
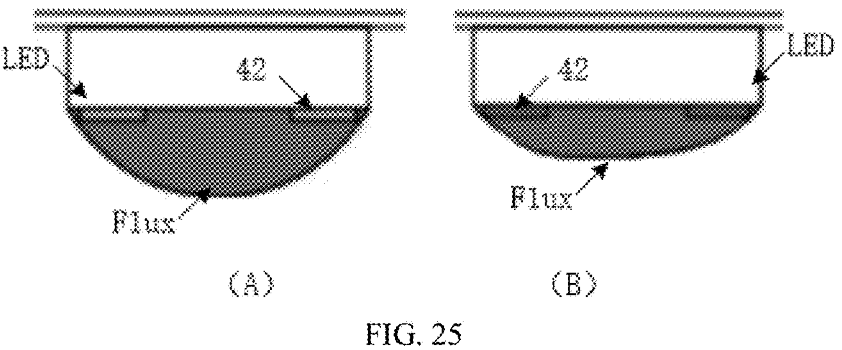

The leads shown in FIG. 20A according to the embodiment of the present application can, during the die bonding, effectively reserve the soldering flux, increase the dipping amount of the soldering flux, and improve the uniformity of the distribution of the soldering flux at the surface of the side of the element device close to the electrically conductive pads. FIG. 25A shows a schematic diagram of the effect of the dipping of the soldering flux of the structure shown in FIG. 20A, and FIG. 25B shows a schematic diagram of the effect of the dipping of the soldering flux of the structure shown in FIG. 20B.

In an exemplary embodiment, if the distance between any two neighboring leads 42 of the same one element device is lower, the amount of the soldering flux that can be reserved between the leads 42 is lower. In the embodiments of the present application, in an aspect, by increasing the quantity of the soldering legs, the effective dipping area of the soldering flux is increased, and, in another aspect, the distance between two neighboring leads is limited to be greater than or equal to 40 μm, thereby increasing the effective dipping amount of the soldering flux, to ameliorate the problem of soldering imperfects caused by a low amount of the soldering flux.

In some embodiments of the present application, the shape of the orthographic projection of each of the leads 42 on the substrate 1 includes any one of a polygon and a shape formed by a polygon and an arc. Both of two opposing faces of two neighboring leads 42 of the same one element device are planes, and the two planes are parallel.

In an exemplary embodiment, the polygon may include a regular polygon, for example, a square. The shape formed by a polygon and an arc may include a sector.

In an exemplary embodiment, two opposing faces of two neighboring leads 42 are the effective contacting faces of the soldering flux, and are closely related to the dipping amount of the soldering flux.

Figure 21:
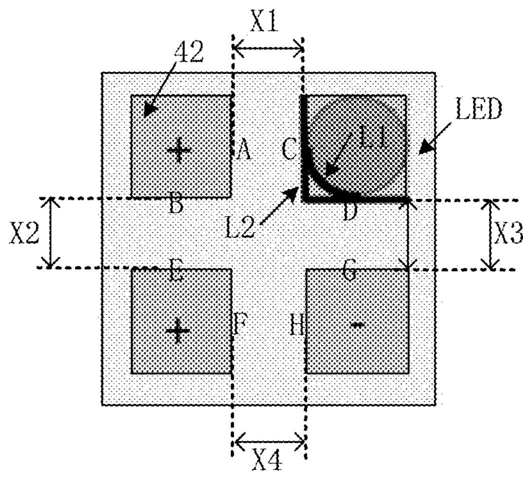
FIGS. 21-24 are schematic structural diagrams of four types of the element devices according to the embodiments of the present application.

In an exemplary embodiment, referring to FIG. 21, the shape of the orthographic projections of the leads 42 on the substrate 1 is a circle. The area of the effective contacting face of a circular lead with the soldering flux is: $H*L1=H*2\pi R*1/4=H*\pi R*1/2$, wherein H is the height of the lead, and R is the radius of the shape of the orthographic projection of the circular lead on the substrate 1. However, when both of two opposing faces of any two neighboring leads 42 of the same one element device are planes and the two planes are parallel and have equal sizes, the area of the effective contacting face of one of the leads is $H*L2=H*2a$, wherein a is the side length of the square lead, and when $2R=a$, $H*L2=H*2a=4RH$. Obviously, 4RH is greater than $H*TR*1/2$. Therefore, in the embodiments of the present application, it is configured that both of two opposing faces of any two neighboring leads 42 of the same one element device are planes, and the two planes are parallel, which can effectively increase the contacting area between the leads and the soldering flux, thereby increasing the dipping amount of the soldering flux, to improve the problem of soldering imperfects.

In some embodiments of the present application, all of the spacings between every two neighboring leads are equal.

In an exemplary embodiment, referring to FIG. 20A, the distance between the lead 42 at the top left corner and the lead 42 at the top right corner is X1, the distance between the lead 42 at the top left corner and the lead 42 at the bottom left corner is X2, the distance between the lead 42 at top right corner and the lead 42 at the bottom right corner is X3, and the distance between the lead 42 at bottom left corner and the lead 42 at the bottom right corner is X4, wherein $X1=X2=X3=X4$, and $X1\geq 40$ μm.

In some embodiments of the present application, the areas of two opposing planes of two neighboring leads are equal.

As an example, that the areas of two opposing planes of two neighboring leads are equal means that, referring to FIG. 21, the areas of the plane A and the plane C are equal, the areas of the plane B and the plane E are equal, the areas of the plane F and the plane H are equal, and the areas of the plane G and the plane D are equal.

In an exemplary embodiment, when the shape of the leads is a tetragonal prism, the areas of the side surfaces of the leads are equal.

In the embodiments of the present application, by configuring that all of the distances between two opposing faces of two neighboring leads are equal, and the areas of two opposing planes of two neighboring leads are equal, the sizes of the spaces between any two opposing leads can be equal, and when the soldering flux is dipped, the amounts of the soldering fluxes that can be contained between any two opposing leads are equal, thereby improving the uniformity of the distribution of the soldering flux between the leads, which can further improve the stability of the soldering between the electrically conductive pads and the element devices.

In some embodiments of the present application, the first connecting layer 22 includes a nickel layer and a gold layer, and the gold layer is located on one side of the nickel layer away from the substrate. The second connecting layers 5 extend throughout a part of an area of the gold layer and extend into the nickel layer.

In an exemplary embodiment, the first connecting layer 22 is mainly formed by the nickel layer, and the gold layer serves to protect the nickel layer, and has a thickness far less than the thickness of the nickel layer. The thicknesses of them may be determined according to actual situations, and are not limited herein.

In an exemplary embodiment, referring to FIG. 8, the array base plate further includes a buffer layer 8, a first trace layer 101, an organic or inorganic insulating layer 9, a planarization layer 10, a reflecting layer 7 and a lens component (Lens) 11. The reflecting layer 7 is located on one side of the insulating layer 6 away from the substrate 1, and the orthographic projection of the reflecting layer 7 on the substrate 1 and the orthographic projection of the element device 3 on the substrate 1 do not intersect or overlap with each other. The material of the reflecting layer may include any one or more of a white ink, a silicon-type white glue and a reflector plate. Certainly, the array base plate may further include other components such as a supporting layer 108, merely the structures and the components that are relevant to the inventiveness are described herein, and the other structures and components included in the array base plate may refer to the related art, and are not discussed herein further.

An embodiment of the present application provides a light emitting apparatus, wherein the light emitting apparatus includes the array base plate stated above.

Figure 26:
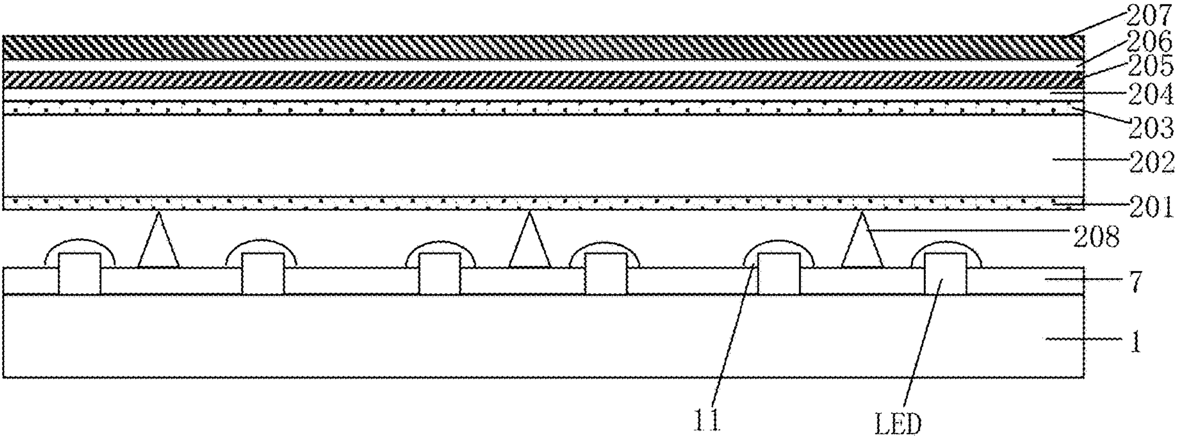
FIG. 26 is a schematic structural diagram of the light emitting apparatus according to an embodiment of the present application.

In an exemplary embodiment, the light emitting apparatus further includes a glass cover plate shown in FIG. 26, and the glass cover plate includes a first ink layer 201, a glass 202 and a second ink layer 203, wherein the first ink layer 201 and the second ink layer 203 are light transmitting films containing diffusing particles. Certainly, the light emitting apparatus further includes a first binding layer 204, a quantum-dot layer 205, a second binding layer 206 and a light enhancing composite film 207.

In an exemplary embodiment, the light emitting apparatus may be used as a backlight device, or may also be used as a displaying device. Particularly, if the plurality of element devices in the light emitting apparatus include light emitting devices that emit lights of a single color, then the light emitting apparatus may be used as a backlight device. If the plurality of element devices in the light emitting apparatus include light emitting devices that emit lights of different colors, for example, three types of the light emitting devices emitting a red light, emitting a green light and emitting a blue light, then the light emitting apparatus may be used as a displaying device.

In an exemplary embodiment, the light emitting apparatus may be a Mini-LED light emitting apparatus. Alternatively, the light emitting apparatus may also be a Micro-LED light emitting apparatus.

In the embodiments of the present application, in light emitting apparatus, by configuring that the electrically conductive pads 2 include the electrically conducting layers 21 and the first connecting layers 22, the soldering material and the material of the first connecting layers 22 of the electrically conductive pads 2 react at a high temperature, an inter-metal-layer compound is generated at the interface between the leads 42 and the first connecting layers 22, the inter-metal-layer compound accumulated together forms the second connecting layers 5, and the second connecting layers 5 fix the leads 42 of the element device and the electrically conductive pads 2 together. After an element device is abnormal and the element device has been detached, referring to FIG. 5, both of the element device and the second connecting layers 5 are stripped, and the surfaces of the first connecting layers 22 of the electrically conductive pads 2 of the array base plate away from the substrate 1 have concaves. When the element device is being re-soldered, the soldering material and the material of the remaining first connecting layers 22 react at a high temperature, to re-generate the second connecting layers 5 shown in FIG. 6, whereby the first connecting layers 22 serve to protect the electrically conducting layers 21, to prevent cracking of the electrically conductive pads 2, thereby increasing the repairing yield of the array base plate, and improving the reliability of the light emitting apparatus.

In the related art, in the production of the array base plate, referring to FIG. 1, firstly the electrically-conductive-pad groups 3 are formed, subsequently the insulating layer 6 and the reflecting layer 7 are sequentially formed, and subsequently die bonding is performed to solder the element device and the electrically conductive pads 2 together. However, when the reflecting layer 7 is formed, the reflecting layer 7 easily leaves a residue on the electrically conductive pads 2, or the solvent of the material of the reflecting layer 7, after volatilizing, easily deposits on the electrically conductive pads 2 (the electrically conducting layers 21), which affects the subsequent process of die bonding and soldering, to cause switching-on imperfects between the element device and the electrically conductive pads. As an example, in the related art, the solvent of the material of the reflecting layer 7 remaining on the electrically conducting layers 21 may include at least one of di(propylene glycol) methyl ether acetate, diethylene glycol dibutyl ether and butyl acetate.

In view of that, an embodiment of the present application provides a method for producing an array base plate, wherein the method includes:

S01: referring to FIG. 4, providing the substrate 1.

S02: forming the electrically conducting layers 21 of the electrically conductive pads 2.

S03: forming the insulating layer 6.

S04: forming the reflecting layer 7.

The material of the reflecting layer 7 includes a titanium dioxide, a resin, a solvent and a filler.

The solvent of the material of the reflecting layer 7 may include at least one of di(propylene glycol) methyl ether acetate, diethylene glycol dibutyl ether and butyl acetate.

S05: forming the first connecting layers 22.

The material of the first connecting layers 22 may include nickel and/or gold, and the electrically conductive pad 2 includes the electrically conducting layer 21 and the first connecting layer 22.

The step S05 of forming the first connecting layers 22 includes:

S051: washing the electrically conducting layers 21.

In an exemplary embodiment, the electrically conducting layers 21 may be soaked and washed by using a solvent. The solvent may include an organic solvent and an inorganic basic solvent. For example, the organic solvent may include at least one of ethanol and butanone. The inorganic basic solvent may include at least one of sodium hydroxide and potassium hydroxide.

The organic solvent may dissolve and remove the substance remaining on the electrically conducting layers 21. The inorganic basic substance can react with the substance remaining on the electrically conducting layers 21 to generate inorganic salts and water.

In an exemplary embodiment, the surface of the electrically conducting layers 21 may be washed by means of plasma treatment or UV illumination, to remove the residue on the surface of the electrically conducting layers 21.

S052: performing surface treatment to the electrically conducting layers 21.

In an exemplary embodiment, the surface treatment may include micro-etching treatment and surface-activation treatment. By surface treatment, in the subsequent chemical plating, the adhesive force between the plating layer and the bottom layer interface can be increased, to improve the quality of the plating layer.

S053: forming the first connecting layers by chemical plating.

By chemical plating, the nickel layer maybe firstly formed, and the gold layer may be formed subsequently.

S06: soldering the element device and the electrically conductive pads 2 together.

In the array base plate produced according to the embodiments of the present application, the reflecting layer 7 is firstly produced, and the first connecting layers 22 of the electrically conductive pads 2 are subsequently produced. In the production of the first connecting layers 22, by the washing and the surface treatment to the surface of the electrically conducting layers 21, the residue of the material of the reflecting layer 7 is removed, which reduces the contact resistance between the first connecting layers 22 and the electrically conducting layers 21, and improves the switching-on performance between the first connecting layers 22 and the electrically conducting layers 21, thereby improving the switching-on stability of the array base plate, and improving the yield of the product.

It should be noted that the array base plate produced by using the producing method according to the embodiments of the present application further includes other structures and components, and the other structures and components included in the array base plate may refer to the above description on the array base plate, and are not discussed herein further.

Additionally, the producing method according to the embodiments of the present application merely describes the producing process relevant to the inventiveness, and the particular producing methods of the other components of the array base plate may refer to the related art, and are not described herein.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. An array base plate, wherein the array base plate comprises:

a substrate; and a plurality of electrically-conductive-pad groups located on the substrate, wherein each of the electrically-conductive-pad groups comprises at least two electrically conductive pads;

the electrically conductive pad comprises an electrically conducting layer and a first connecting layer, the first connecting layer is located on one side of the electrically conducting layer away from the substrate, and an orthographic projection of the first connecting layer on the substrate and an orthographic projection of the electrically conducting layer on the substrate at least partially intersect or overlap; and a thickness of the first connecting layer in a thickness direction of the substrate is greater than or equal to a thickness of the electrically conducting layer in the thickness direction of the substrate;

the array base plate further comprises an insulating layer, and the insulating layer is located between the electrically conductive pads of a same one electrically-conductive-pad group;

wherein an orthographic projection of the insulating layer on the substrate and the orthographic projection of the electrically conducting layer on the substrate do not intersect or overlap with each other.

2. The array base plate according to claim 1, wherein a distance from a surface of the insulating layer away from the substrate to the substrate in the thickness direction of the substrate is less than or equal to a distance from a surface of the first connecting layer away from the substrate to the substrate in the thickness direction of the substrate.

3. The array base plate according to claim 2, wherein the distance from the surface of the insulating layer away from the substrate to the substrate in the thickness direction of the substrate is greater than a distance from a surface of the electrically conducting layer away from the substrate to the substrate in the thickness direction of the substrate.

4. The array base plate according to claim 1, wherein the orthographic projection of the first connecting layer on the substrate and the orthographic projection of the insulating layer on the substrate do not intersect or overlap with each other.

5. The array base plate according to claim 1, wherein the array base plate further comprises a plurality of second connecting layers and a plurality of element devices, the second connecting layers are located on one side of the first connecting layer away from the substrate, and orthographic projections of the second connecting layers on the substrate are located within the orthographic projection of the first connecting layer on the substrate;

the electrically conductive pads of one electrically-conductive-pad group are electrically connected to one element device by the second connecting layers; and a maximum thickness of the first connecting layer in the thickness direction of the substrate is greater than a maximum thickness of the second connecting layers in the thickness direction of the substrate.

6. The array base plate according to claim 5, wherein the maximum thickness of the first connecting layer in the thickness direction of the substrate is greater than or equal to two times of the maximum thickness of the second connecting layers in the thickness direction of the substrate.

7. The array base plate according to claim 5, wherein each of the element devices comprises an element device body and at least one lead, the array base plate further comprises a soldering layer located between the lead and the first connecting layer, and the soldering layer comprises a soldering material; and in a predetermined condition, an extent of reaction between a material of the first connecting layer and a material of the soldering layer is less than an extent of reaction between a material of the electrically conducting layer and the material of the soldering layer.

8. The array base plate according to claim 5, wherein the array base plate comprises a device disposing area and a bonding area that are located on the substrate;

the device disposing area comprises the element devices, the electrically-conductive-pad groups and the second connecting layers; and the bonding area comprises a circuit board, the electrically-conductive-pad groups and the second connecting layers, and the circuit board is electrically connected to the electrically-conductive-pad groups by the second connecting layers.

9. The array base plate according to claim 8, wherein a thickness of the first connecting layer within the device disposing area in the thickness direction of the substrate ranges 2 μm-5 μm; and a thickness of the first connecting layer within the bonding area in the thickness direction of the substrate ranges 2 μm-4 μm.

10. The array base plate according to claim 5, wherein a shape of an orthographic projection of each of the element devices on the substrate comprises a rectangle, and a length-width ratio of the rectangle ranges 1:1-1.5:1.

11. The array base plate according to claim 10, wherein each of the element devices comprises at least four leads, a quantity of the leads is equal to a quantity of the electrically conductive pads in each of the electrically-conductive-pad groups, the leads of a same one element device are electrically connected to the electrically conductive pads of a same one electrically-conductive-pad group;

orthographic projections of the leads on the substrate are located within the orthographic projection of the first connecting layer on the substrate; and a minimum distance between any two neighboring leads of a same one element device is greater than or equal to 40 μm.

12. The array base plate according to claim 11, wherein a shape of an orthographic projection of each of the leads on the substrate comprises any one of a polygon and a shape formed by a polygon and an arc; and both of two opposing faces of two neighboring leads of a same one element device are planes, and the two planes are parallel.

13. The array base plate according to claim 12, wherein all of spacings between every two neighboring leads are equal.

14. The array base plate according to claim 12, wherein areas of the two planes are equal.

15. The array base plate according to claim 5, wherein the first connecting layer comprises a nickel layer and a gold layer, and the gold layer is located on one side of the nickel layer away from the substrate; and the second connecting layers extend throughout a part of an area of the gold layer and extend into the nickel layer.

16. A light emitting apparatus, wherein the light emitting apparatus comprises the array base plate according to claim 1.

17. The light emitting apparatus according to claim 16, wherein a distance from a surface of the insulating layer away from the substrate to the substrate in the thickness direction of the substrate is less than or equal to a distance from a surface of the first connecting layer away from the substrate to the substrate in the thickness direction of the substrate.

* * * * *